United States Patent
Imai et al.

(10) Patent No.: US 10,141,453 B2
(45) Date of Patent: Nov. 27, 2018

(54) SEMICONDUCTOR DEVICE

(71) Applicant: Sharp Kabushiki Kaisha, Sakai, Osaka (JP)

(72) Inventors: Hajime Imai, Sakai (JP); Tohru Daitoh, Sakai (JP); Hisao Ochi, Sakai (JP); Tetsuo Fujita, Sakai (JP); Hideki Kitagawa, Sakai (JP); Tetsuo Kikuchi, Sakai (JP); Masahiko Suzuki, Sakai (JP); Shingo Kawashima, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/539,541

(22) PCT Filed: Dec. 15, 2015

(86) PCT No.: PCT/JP2015/085081
§ 371 (c)(1),
(2) Date: Jun. 23, 2017

(87) PCT Pub. No.: WO2016/104253
PCT Pub. Date: Jun. 30, 2016

(65) Prior Publication Data
US 2017/0352765 A1 Dec. 7, 2017

(30) Foreign Application Priority Data
Dec. 25, 2014 (JP) .................................. 2014-262437

(51) Int. Cl.
*H01L 29/786* (2006.01)
*G02F 1/1368* (2006.01)
*H01L 21/28* (2006.01)
*H01L 29/41* (2006.01)
*G02F 1/1343* (2006.01)
(Continued)

(52) U.S. Cl.
CPC ...... *H01L 29/78696* (2013.01); *G02F 1/1368* (2013.01); *G02F 1/134309* (2013.01);
(Continued)

(58) Field of Classification Search
CPC .................................................. H01L 29/78696
See application file for complete search history.

(56) References Cited

U.S. PATENT DOCUMENTS

2005/0073620 A1* 4/2005 Gotoh ............... G02F 1/136213
349/44
2010/0289020 A1 11/2010 Yano et al.
(Continued)

FOREIGN PATENT DOCUMENTS

JP  2011-100117 A  5/2011
JP  2012-134475 A  7/2012
(Continued)

*Primary Examiner* — Sitaramarao S Yechuri
(74) *Attorney, Agent, or Firm* — ScienBiziP, P.C.

(57) ABSTRACT

A semiconductor device (100) includes: a substrate (10); and a thin film transistor (5) supported on the substrate, the thin film transistor including a gate electrode (12), an oxide semiconductor layer (18), a gate insulating layer (20) provided between the gate electrode and the oxide semiconductor layer, and a source electrode (14) and a drain electrode (16) electrically connected to the oxide semiconductor layer, wherein: the drain electrode is shaped so as to project toward the oxide semiconductor layer; a width W1 and a width W2 satisfy a relationship $|W1-W2| \le 1$ μm, where the width W1 is a width of the oxide semiconductor layer in a channel width direction of the thin film transistor, and the width W2 is a width of the drain electrode in a direction perpendicular to a direction in which the drain electrode projects; and the width W1 and the width W2 are 3 μm or more and 6 μm or less.

9 Claims, 7 Drawing Sheets

(51) Int. Cl.
  *H01L 27/12*       (2006.01)
  *H01L 29/24*       (2006.01)
  *H01L 29/417*      (2006.01)
  *G02F 1/1362*      (2006.01)

(52) U.S. Cl.
  CPC ............ *H01L 21/28* (2013.01); *H01L 27/124* (2013.01); *H01L 27/127* (2013.01); *H01L 27/1225* (2013.01); *H01L 29/24* (2013.01); *H01L 29/41* (2013.01); *H01L 29/41733* (2013.01); *H01L 29/786* (2013.01); *H01L 29/7869* (2013.01); *H01L 29/78618* (2013.01); *G02F 1/13439* (2013.01); *G02F 1/136286* (2013.01); *G02F 2001/134372* (2013.01); *G02F 2202/10* (2013.01)

(56) References Cited

U.S. PATENT DOCUMENTS

| | | |
|---|---|---|
| 2011/0085104 A1 | 4/2011 | Arasawa et al. |
| 2011/0121878 A1* | 5/2011 | Kato ........................ G11C 7/04 327/215 |
| 2012/0001881 A1* | 1/2012 | Miyake ................ G09G 3/3648 345/209 |
| 2012/0138922 A1 | 6/2012 | Yamazaki et al. |
| 2013/0161608 A1* | 6/2013 | Yamazaki ........... H01L 29/7869 257/43 |
| 2013/0320334 A1 | 12/2013 | Yamazaki et al. |
| 2014/0138676 A1 | 5/2014 | Yamazaki et al. |
| 2014/0286076 A1 | 9/2014 | Aoki et al. |
| 2015/0076492 A1* | 3/2015 | Kubota ............... H01L 27/1225 257/43 |
| 2015/0255491 A1 | 9/2015 | Uchida |

FOREIGN PATENT DOCUMENTS

| | | |
|---|---|---|
| JP | 2012-252349 A | 12/2012 |
| JP | 2014-007399 A | 1/2014 |
| JP | 2014-116592 A | 6/2014 |
| JP | 2014-209727 A | 11/2014 |
| WO | 2009/075281 A1 | 6/2009 |
| WO | 2014/069260 A1 | 5/2014 |

\* cited by examiner (a)

(b)

(a)

(b)

(c)

(a)

(b)

SEMICONDUCTOR DEVICE

TECHNICAL FIELD

The present invention relates to a semiconductor device including elements formed by using an oxide semiconductor.

BACKGROUND ART

An active matrix substrate used in a liquid crystal display device, or the like, includes a switching element such as a thin film transistor (hereinafter "TFT") for each pixel. As such a switching element, a TFT using an oxide semiconductor layer as the active layer (hereinafter referred to as an "oxide semiconductor TFT") is known in the art. Patent Document No. 1 discloses a liquid crystal display device using InGaZnO (an oxide composed of indium, gallium and zinc) in the active layer of the TFT.

Oxide semiconductor TFTs are capable of operating faster than amorphous silicon TFTs. Since oxide semiconductor films are formed by a simpler process than polycrystalline silicon films, it can be applied to devices that require large areas. Thus, oxide semiconductor TFTs have had high expectations as high-performance active elements that can be manufactured while suppressing the number of manufacturing steps and the manufacturing cost.

Since an oxide semiconductor has a high mobility, it is possible to realize a level of performance that is greater than or equal to that of an amorphous silicon TFT even when the element size is reduced relative to an amorphous silicon TFT. Thus, when an active matrix substrate of a display device is manufactured by using an oxide semiconductor TFT, it is possible to reduce the area of the TFT within a pixel, thereby improving the pixel aperture ratio. Thus, it is possible to produce bright display even when the amount of light of the backlight is reduced, thereby realizing a low power consumption.

Since oxide semiconductor TFTs have desirable off-leak characteristics, it is possible to use a driving method with which display is produced while reducing the image data rewrite frequency. For example, when displaying a still image, they can be driven so that the image data is rewritten once per second. Such a driving method is called pause drive or low-frequency drive, and it is possible to significantly reduce the power consumption of the display device.

CITATION LIST

Patent Literature

[Patent Document No. 1] Japanese Laid-Open Patent Publication No. 2012-134475
[Patent Document No. 2] Japanese Laid-Open Patent Publication No. 2012-252349] Japanese Laid-Open Patent Publication No.

SUMMARY OF INVENTION

Technical Problem

With active matrix substrates, there is a demand for reducing, as much as possible, parasitic capacitances that are associated with TFTs and lines. The parasitic capacitances include the gate-source parasitic capacitance $C_{gs}$ and the gate-drain parasitic capacitance $C_{gd}$ in TFTs. If these parasitic capacitances associated with TFTs are significant, signals are delayed and blunted, and the power consumption increases.

With active matrix substrates for use in liquid crystal display devices, a feed-through voltage (pull-in voltage) $\Delta V_d$ is known to occur due to the gate-drain parasitic capacitance $C_{gd}$. The feed-through voltage $\Delta V_d$ is a drop in the signal voltage occurring at the moment when a TFT switches from ON to OFF, and the greater the gate-drain parasitic capacitance $C_{gd}$ is, the greater the feed-through voltage $\Delta V_d$. A drop in the signal voltage occurs on the negative side whether the signal voltage has a positive polarity or a negative polarity. As a result, there will be a difference in the level of the signal voltage between the positive polarity and the negative polarity. Therefore, when display is produced by inverting the polarity of the signal voltage, there will be a difference in brightness for every polarity inversion cycle (typically, one frame) even if display is produced with the same gray level voltage, resulting in flicker or display non-uniformity. Particularly, when low-frequency drive is performed at less than 60 Hz as described above, if blinking occurs at 1 to 30 Hz, for example, it is known to be likely perceived as flicker by human eyes. Moreover, when one attempts to correct the variations in the level of the signal voltage due to polarity, it is necessary to apply an appropriate counter voltage for the common electrode, thereby increasing the power consumption.

Configurations have been employed in the art, in which either the oxide semiconductor layer or the source electrode and the drain electrode is wider than the other. For example, Patent Document No. 2 discloses a configuration in which an oxide semiconductor layer is provided with a larger width than the source and drain electrodes over the scanning line. With such a configuration, even if the oxide semiconductor layer and the drain electrode are formed slightly misaligned with each other in the manufacturing process, for example, it is possible to keep the same connection area between the oxide semiconductor layer and the drain electrode. Therefore, it is possible to suppress the variations in the parasitic capacitance $C_{gd}$ from one pixel to another. It has been believed that with such a configuration, the TFT channel width does not vary even if some misalignment occurs, and it is therefore easy to realize more stable device characteristics.

However, if one employs such a configuration in which some margin against misalignment is ensured, the parasitic capacitance of the TFT will be large. Therefore, nowadays, pixels have been miniaturized, and there is a demand for a TFT configuration capable of realizing a smaller parasitic capacitance, suppressing the signal delay and reducing the power consumption.

It is an object of the present invention, which has been made in view of the problems set forth above, to provide a semiconductor device including an oxide semiconductor TFT, in which the parasitic capacitance of the TFT is reduced.

Solution to Problem

A semiconductor device according to an embodiment of the present invention includes: a substrate; and a thin film transistor supported on the substrate, the thin film transistor including a gate electrode, an oxide semiconductor layer, a gate insulating layer provided between the gate electrode and the oxide semiconductor layer, and a source electrode and a drain electrode electrically connected to the oxide semiconductor layer, wherein: the drain electrode is shaped so as to project toward the oxide semiconductor layer; a width W1 and a width W2 satisfy a relationship |W1−W2|≤1 μm, where the width W1 is a width of the oxide semiconductor layer in a channel width direction of the thin film transistor, and the width W2 is a width of the drain electrode in a direction perpendicular to a direction in which the drain electrode projects; and the width W1 and the width W2 are 3 μm or more and 6 μm or less.

In one embodiment, the semiconductor device further includes a signal line connected to the source electrode and a scanning line connected to the gate electrode, the scanning line extending along a first direction and the signal line extending along a second direction crossing the first direction, wherein the drain electrode, the source electrode and the oxide semiconductor layer are arranged in line along either the first direction or the second direction.

In one embodiment, the gate electrode is a portion of the scanning line, and the scanning line including the gate electrode extends straight along the first direction.

In one embodiment, the source electrode is shaped so as to project along the second direction, and the drain electrode is arranged so as to oppose the source electrode with the oxide semiconductor layer interposed therebetween.

In one embodiment, a connecting portion between the signal line and the source electrode and an extension of the drain electrode opposing the source electrode are located on opposite sides of the scanning line therebetween.

In one embodiment, the oxide semiconductor layer is provided so as to extend past opposite edges of the scanning line.

In one embodiment, the width W1 and a width W3 satisfy |W1−W3|≤1 μm, where the width W3 is a width in the first direction of an overlapping portion between the oxide semiconductor layer and the drain electrode.

In one embodiment, the oxide semiconductor layer and the drain electrode are misaligned from each other in the first direction; and a width W3 is 1 μm or more and is less than the width W1, where the width W3 is a width in the first direction of an overlapping portion between the oxide semiconductor layer and the drain electrode.

In one embodiment, the source electrode is a portion of the signal line that is connected to the oxide semiconductor layer; the drain electrode is shaped so as to extend along the second direction past an edge of the scanning line so as to project onto the scanning line; and a length in the second direction of an overlapping portion between the oxide semiconductor layer and the drain electrode is 1 μm or more and is less than or equal to the width W1.

In one embodiment, the oxide semiconductor layer is provided over the scanning line and within the scanning line so as not to extend past an edge of the scanning line.

A semiconductor device according to an embodiment of the present invention includes: a substrate; and a thin film transistor supported on the substrate, the thin film transistor including a gate electrode, an oxide semiconductor layer, a gate insulating layer provided between the gate electrode and the oxide semiconductor layer, and a source electrode and a drain electrode electrically connected to the oxide semiconductor layer, wherein: the drain electrode is shaped so as to project toward the oxide semiconductor layer; and a width W4 is 1 μm or more and is less than or equal to a width W1, where the width W1 is a width of the oxide semiconductor layer in a channel width direction of the thin film transistor, and the width W4 is an overlap width, in a width direction of the oxide semiconductor layer, of an overlapping portion between the drain electrode and the oxide semiconductor layer.

In one embodiment, the width W4 is less than the width W1.

In one embodiment, the oxide semiconductor layer includes In, Ga and Zn.

In one embodiment, the oxide semiconductor layer includes a crystalline portion.

In one embodiment, the thin film transistor is a channel-etch type TFT.

Advantageous Effects of Invention

According to an embodiment of the present invention, it is possible to provide a semiconductor device with a reduced parasitic capacitance, with which it is possible to improve the response speed and reduce the power consumption.

DESCRIPTION OF EMBODIMENTS

A semiconductor device according to an embodiment of the present invention will now be described with reference to the drawings. The semiconductor device of the present embodiment includes an oxide semiconductor TFT. Note that the semiconductor device of the present embodiment is only required to include an oxide semiconductor TFT, and it may generally include active matrix substrates, various display devices, electronic devices, etc.

(Embodiment 1)

Figure 1:
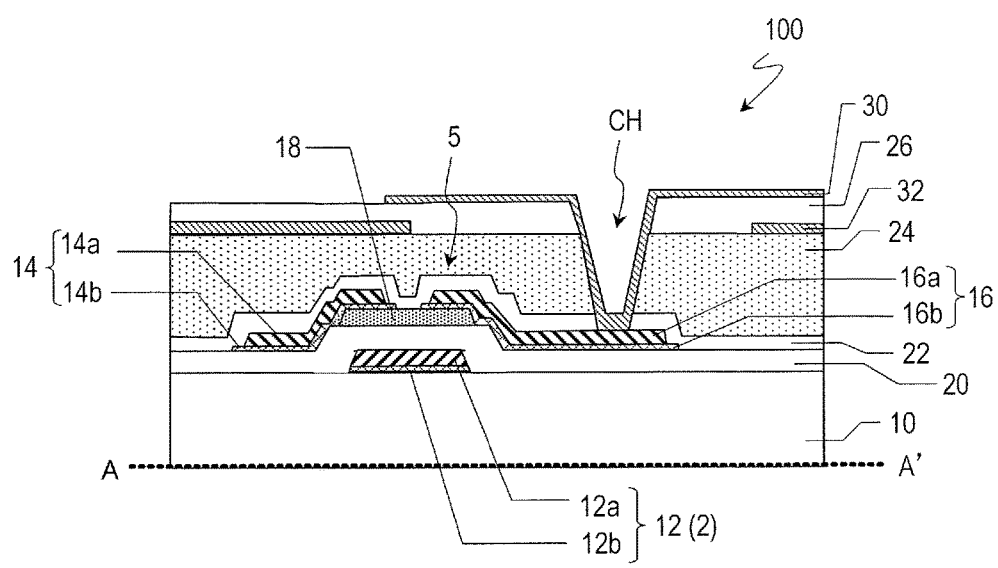
FIG. 1 A schematic cross-sectional view showing a semiconductor device (active matrix substrate) of Embodiment 1.

FIG. 1 is a cross-sectional view showing, on an enlarged scale, the vicinity of an oxide semiconductor TFT 5 of an active matrix substrate (semiconductor device) 100 of Embodiment 1. The active matrix substrate 100 is used in a liquid crystal display device that operates in an FFS (Fringe Field Switching) mode, for example.

The oxide semiconductor TFT 5 provided on the active matrix substrate 100 includes a gate electrode 12 provided on a substrate 10, a gate insulating layer 20 covering the gate electrode 12, a typically island-shaped oxide semiconductor layer 18 arranged on the gate insulating layer 20 so as to at least partially overlap with the gate electrode 12, and a source electrode 14 and a drain electrode 16 connected to the oxide semiconductor layer 18. The source electrode 14 and the drain electrode 16 are arranged with an interval therebetween so as to be spaced apart from each other over the oxide semiconductor layer 18. The oxide semiconductor TFT 5 has a channel-etch type structure (back channel etch (BCE) structure).

In the "channel-etch type TFT", an etch-stop layer is absent on the channel region formed in the oxide semiconductor layer 18, and channel-side end portions of source and drain electrodes 14 and 16 are arranged so as to be in contact with the upper surface of the oxide semiconductor layer 18. The channel-etch type TFT is formed for example by forming a source-drain electrode conductive film on the oxide semiconductor layer 18 and performing a source-drain separation step, as will be described later. In the source-drain separation step, a surface portion of the channel region may be etched.

On the other hand, a TFT (etch-stop-type TFT) including an etch-stop layer provided on the channel region of the oxide semiconductor layer is also known in the art. In an etch-stop-type TFT, channel-side end portions of the source and drain electrodes are located over the etch-stop layer, for example. An etch-stop-type TFT is formed for example by forming an etch-stop layer covering a portion of the oxide semiconductor layer that is to be the channel region, then forming a source-drain electrode conductive film on the oxide semiconductor layer and the etch-stop layer, and performing a source-drain separation step.

With the etch-stop type, the etching damage to the channel region is reduced, but the device size tends to increase. It also separately requires the step of providing the etch-stop layer. Therefore, the channel-etch type is advantageous over the etch-stop type in view of reducing the size of the device or simplifying the manufacturing process. Particularly, when applied to display devices that have been made smaller with higher definitions and made with narrower bezels, the size of the TFT is preferably as small as possible, and such a channel-etch type TFT as that of the present embodiment has a configuration that is suitable for such applications.

In the channel-etch type oxide semiconductor TFT 5 of the present embodiment, the source electrode 14 and the drain electrode 16 include upper layers 14a and 16a and lower layers 14b and 16b. The upper layers 14a and 16a are formed from Cu, for example, and the lower layers 14b and 16b are formed from Ti, for example. Note that in the present specification, such a layered structure may be denoted as Cu/Ti.

By using Cu, which is highly conductive, for the upper layers 14a and 16a, it is possible to lower the wiring resistance and suppress the signal delay. Particularly, with an active matrix substrate for use in a small-sized, high-definition display device, the use of low-resistance Cu wiring provides a significant advantage of suppressing the signal delay and the signal blunting. Note however that since Cu easily diffuses and forms an oxide, it is preferred to suppress the influence of diffusion of Cu into the oxide semiconductor layer 18.

By providing the lower layer formed from Ti or Mo, it is possible to reduce the contact resistance between the oxide semiconductor layer and the source-drain electrode.

Note however that the present invention is not limited to the configuration described above, and the source-drain electrodes 14 and 16 may have various configurations and may include a single layer structure or a layered structure of three layers or more. The source-drain electrodes 14 and 16 may have a three-layer structure of Ti/Al/Ti in this order from the upper layer. Other layered structures may include Cu/Mo, Cu/Mo alloy, Cu alloy/Cu/Ti, Mo/Cu/Ti, Mo alloy/Cu/Ti, Al/Ti, Mo/Al/Mo, Mo/Al/Ti, etc. Note that the alloy of Cu or Mo described above may include for example Ca, Mg, Al, Nb, Mn, Ni, etc., as an alloy additive. The lowermost electrode layer in contact with the oxide semiconductor layer 18 may include TiN or Ti oxide, etc.

As does the source-drain electrode, the gate electrode 12 may have a layered structure of an upper layer 12a/a lower layer 12b (e.g., Cu/Ti). By employing a similar configuration for an SD layer (the layer including a signal line 4 (see FIG. 2(a)), the source electrode 14 and the drain electrode 16) and for a gate layer (the layer including a gate line 2 and the gate electrode 12), it is possible to realize an advantage of simplifying the manufacturing process.

With the active matrix substrate 100 of the present embodiment, a common electrode 32 is provided on a flattening layer 24. The common electrode 32 is covered by an inter-layer insulating layer (inorganic insulating layer) 26, and a pixel electrode 30 opposes the common electrode 32 with the inter-layer insulating layer 26 interposed therebetween.

Figure 6:
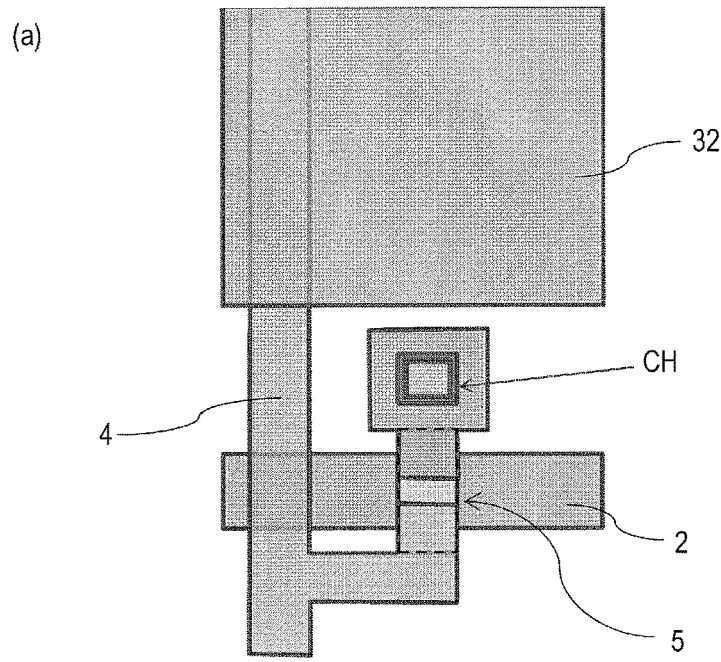
FIG. 6 Plan views illustrating the method for manufacturing the semiconductor device of Embodiment 1, wherein (a) and (b) show different steps.
Figure 6:
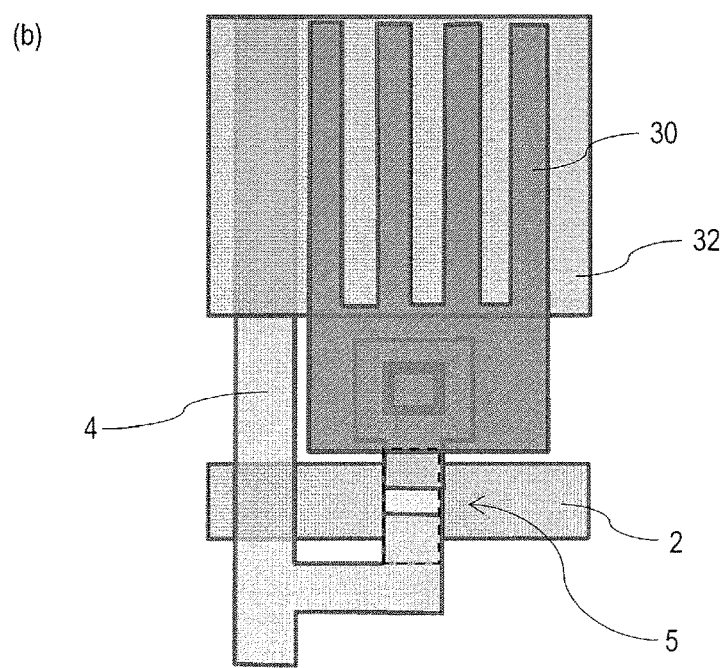

As shown in FIG. 6(b), the pixel electrode 30 includes a plurality of straight portions (or one or more slits), and is connected to the drain electrode 16 of the oxide semiconductor TFT 5 inside a contact hole CH running through the inter-layer insulating layer 26, the flattening layer 24 and a protection layer 22. On the other hand, the common electrode 32 has an opening that is enlarged to the region outside the contact hole CH, and is insulated from the pixel electrode 30 by the inter-layer insulating layer 26. With this configuration, it is possible to form a fringe electric field between the pixel electrode 30 and the common electrode 32.

Note that with the active matrix substrate 100, the gate insulating layer 20 may have a layered structure including a lower layer insulating layer, and an upper layer insulating layer provided on the lower layer insulating layer. The lower surface of the lower layer insulating layer is in contact with the substrate 10, the gate electrode 12, etc., and the upper surface of the upper layer insulating layer is in contact with the oxide semiconductor layer 18 and the source-drain electrodes 14 and 16.

The lower layer insulating layer may be formed from $SiN_x$ or $SiN_xO_y$, for example, and the upper layer insulating layer may be formed from $SiO_2$ or $SiO_xN_y$, for example. When an oxygen-containing layer (e.g., an oxide layer such as $SiO_2$) is used as the upper layer insulating layer in contact with the oxide semiconductor layer 18, even if oxygen deficiency occurs in the oxide semiconductor layer 18, the oxygen deficiency can be recovered with oxygen contained in the oxide layer.

Similarly, with the channel-etch type oxide semiconductor TFT 5, the protection layer 22 covering it may also have a layered structure, and the lower layer protection layer to be in contact with the oxide semiconductor layer 18 may be formed from an oxygen-containing layer (e.g., $SiO_2$). Note that the upper layer protection layer may be formed from $SiN_x$.

The oxide semiconductor included in the oxide semiconductor layer 18 described above may be an amorphous oxide semiconductor or a crystalline oxide semiconductor having a crystalline portion. Examples of the crystalline oxide semiconductor include a polycrystalline oxide semiconductor, a microcrystalline oxide semiconductor, etc. The crystalline oxide semiconductor may be a crystalline oxide semiconductor whose c-axis is oriented generally vertical to the layer surface, etc.

The oxide semiconductor layer 18 may have a layered structure of two or more layers. When the oxide semiconductor layer 18 has a layered structure, the oxide semiconductor layer 18 may include an amorphous oxide semiconductor layer and a crystalline oxide semiconductor layer. Alternatively, it may include a plurality of crystalline oxide semiconductor layers having different crystalline structures. When the oxide semiconductor layer 18 has a 2-layer structure including an upper layer and a lower layer, the energy gap of the oxide semiconductor included in the upper layer is preferably greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer.

The material, the structure and the deposition method of the amorphous oxide semiconductor, those of the crystalline oxide semiconductors described above, and the structure of the oxide semiconductor layer having a layered structure, etc., are described in Japanese Laid-Open Patent Publication No. 2014-007399, for example. The entire disclosure of Japanese Laid-Open Patent Publication No. 2014-007399 is herein incorporated by reference.

The oxide semiconductor layer 18 may include at least one metal element from among In, Ga and Zn, for example. In the present embodiment, the oxide semiconductor layer includes an In—Ga—Zn—O-based semiconductor, for example. Herein, the In—Ga—Zn—O-based semiconductor is a ternary oxide of In (indium), Ga (gallium) and Zn (zinc), and there is no particular limitation on the ratio (composition ratio) between In, Ga and Zn, e.g., In:Ga:Zn=2:2:1, In:Ga:Zn=1:1:1, In:Ga:Zn=1:1:2, etc. Such an oxide semiconductor layer 18 may be formed from an oxide semiconductor film including an In—Ga—Zn—O-based semiconductor. Note that a channel-etch type TFT having an active layer including an In—Ga—Zn—O-based semiconductor may be referred to as a "CE-InGaZnO-TFT".

The In—Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally vertical to the layer surface, etc.

Note that the crystalline structure of the crystalline In—Ga—Zn—O-based semiconductor is disclosed for example in Japanese Laid-Open Patent Publication No. 2014-007399, Japanese Laid-Open Patent Publication No. 2012-134475, Japanese Laid-Open Patent Publication No. 2014-209727, etc., mentioned above. The entire disclosures of Japanese Laid-Open Patent Publication No. 2012-134475 and Japanese Laid-Open Patent Publication No. 2014-209727 are herein incorporated by reference. A TFT including an In—Ga—Zn—O-based semiconductor layer, which has a high mobility (greater than 20 times that of an a-Si TFT) and a lower leak current (less than 1/100 that of an a-Si TFT), can suitably be used as a driver TFT (a TFT forming a peripheral circuit) and a pixel TFT.

The oxide semiconductor layer 18 may include any other oxide semiconductor instead of an In—Ga—Zn—O-based semiconductor. For example, it may include an In—Sn—Zn—O-based semiconductor (e.g., $In_2O_3$—$SnO_2$—$ZnO$). The In—Sn—Zn—O-based semiconductor is a ternary oxide including In (indium), Sn (tin) and Zn (zinc). Alternatively, the oxide semiconductor layer 18 may include an In—Al—Zn—O-based semiconductor, an In—Al-Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, etc.

FIG. 2(a) is a plan view showing, on an enlarged scale, the vicinity of the oxide semiconductor TFT 5 of the active matrix substrate 100 of the present embodiment. Note that the cross section taken along line A-A' of FIG. 2(a) corresponds to the cross-sectional view of FIG. 1.

As shown in FIG. 2(a), the gate electrode 12 of the oxide semiconductor TFT 5 is connected to a scanning line 2, and the source electrode 14 is connected to a signal line 4. The scanning line 2 and the signal line 4 extend in directions crossing each other (typically, directions perpendicular to each other). Note that in the present embodiment, a portion of the scanning line 2 that overlaps with the oxide semiconductor layer 18 functions as the gate electrode 12 of the TFT 5.

In the present specification, the direction in which the signal line 4 extends is the Y direction (the vertical direction or the second direction) and the direction in which the scanning line 2 extends is the X direction (the horizontal direction or the first direction), as shown in FIG. 2(a). In the present embodiment, the source electrode 14 is connected to the signal line 4 via a connecting portion protruding in the X direction from the signal line 4. The source electrode 14 is provided so as to protrude from the connecting portion described above along the Y direction toward the gate electrode 12 and the oxide semiconductor layer 18. The source electrode 14 and the drain electrode 16 are arranged so as to oppose each other with an interval therebetween along the Y direction over the scanning line 2 (or the gate electrode 12) extending in the X direction. The drain electrode 16 also has a shape that protrudes toward the gate electrode 12 and the oxide semiconductor layer 18.

In this configuration, the source connecting portion between the signal line 4 and the source electrode 14 and an extension 16E of the drain electrode 16 (which may be referred to hereinafter as the "drain extension 16E") are located on the opposite sides of the scanning line 2 therebetween. Note that the drain extension 16E is a portion for electrically connecting together the pixel electrode 30 and the drain electrode 16.

As shown in FIG. 2(a), in the present embodiment, the width W2 of the source electrode 14 and the drain electrode 16 of the TFT 5 is generally equal to the width W1 of the oxide semiconductor layer 18. Note that in the present specification, "the width W1 of the oxide semiconductor layer being equal to (or generally equal to) the width W2 of the source-drain electrode" may include not only cases where the width W1 and the width W2 are completely equal to each other but also cases where the absolute value of the difference between the width W1 and the width W2 is 1 μm or less (i.e., |W1−W2|≤1 μm). This means that even when the width W1 and the width W2 are designed to be equal to each other, the actual product often has slightly different widths, and the upper limit of the error is about 1 μm.

Herein, the width W2 of the source electrode and the drain electrode is defined in the direction in which the scanning line 2 extends (the X direction). The width W2 of the source electrode 14 and the drain electrode 16 is a width that is defined in a direction (herein, the X direction) that is perpendicular to the direction in which these electrodes project. The width W1 of the oxide semiconductor layer 18 is defined in the same X direction.

The width W1 of the oxide semiconductor layer 18 is a width that is defined as the channel width direction of the TFT 5, and the width W1 corresponds to the channel width of the TFT 5 in the present embodiment. Note however that when the oxide semiconductor layer 18 is formed misaligned with the source-drain electrodes 14 and 16 (FIG. 3), the width W1 of the oxide semiconductor layer 18 may not be generally equal to the channel width of the TFT 5 even if the width W1 and the width W2 are equal to each other. The channel width of the TFT 5 may be defined as the width of the area over which the source electrode 14 and the drain electrode 16 overlap with the oxide semiconductor layer 18 (the width W3 shown in FIG. 3), and the channel length may be defined as the distance between the source electrode 14 and the drain electrode 16. In the configuration shown in FIG. 2, the width W3 of the overlapping portion and the width W1 of the oxide semiconductor layer (or drain electrode) are substantially equal to each other (i.e., |W1−W3|≤1 μm).

Thus, when the width W1 of the oxide semiconductor layer and the width W2 of the source-drain electrode are equal to each other, the area over which the gate line 2 (or the gate electrode 12) and the source-drain electrodes 14 and 16 overlap with each other with the gate insulating layer 20 interposed therebetween is minimized, thereby also minimizing the parasitic capacitances Cgs and Cgd. For example, when the width W2X of the source electrode and the drain electrode is large with respect to the width W1, as in the reference example shown in FIG. 2(b), the parasitic capacitances Cgs and Cgd are higher than in the configuration shown in FIG. 2(a). Therefore, when the goal is to reduce the parasitic capacitance, it is preferred that the width W2 and the width W1 are equal to each other.

Herein, the width W1 of the oxide semiconductor layer and the width W2 of the source-drain electrode may be determined taking into consideration limitations of the manufacturing process (process rules). By setting the width W1 and the width W2 to the minimum width that can be realized with an actual manufacturing process (typically, 3 μm or more and 6 μm or less), it is possible to minimize the parasitic capacitances Cgs and Cgd.

Figure 2:
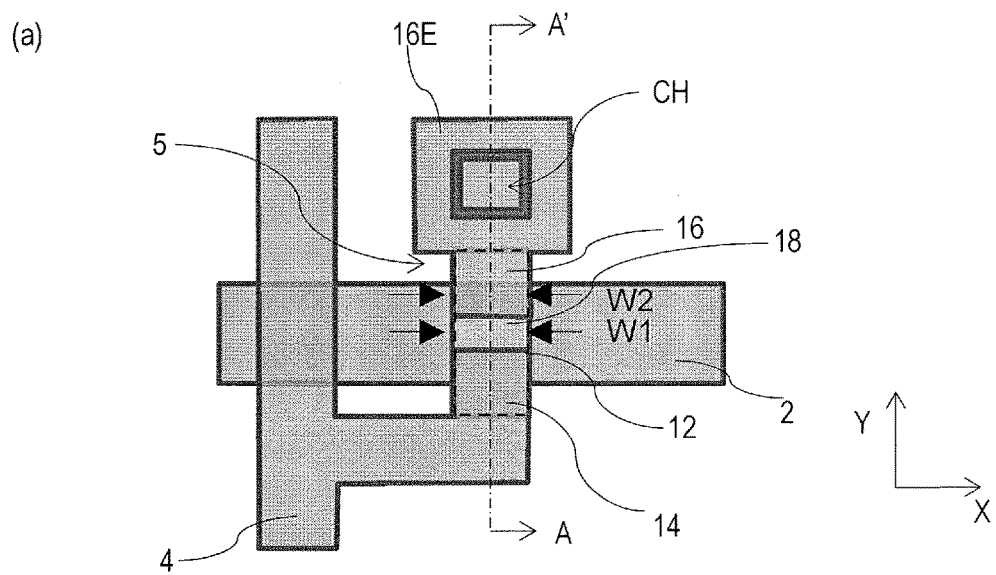
FIG. 2(a) is a schematic plan view showing, on an enlarged scale, the vicinity of a TFT of the semiconductor device of Embodiment 1, and (b) is a schematic plan view showing, an enlarged scale, the vicinity of a TFT of a semiconductor device of a reference example.
Figure 2:
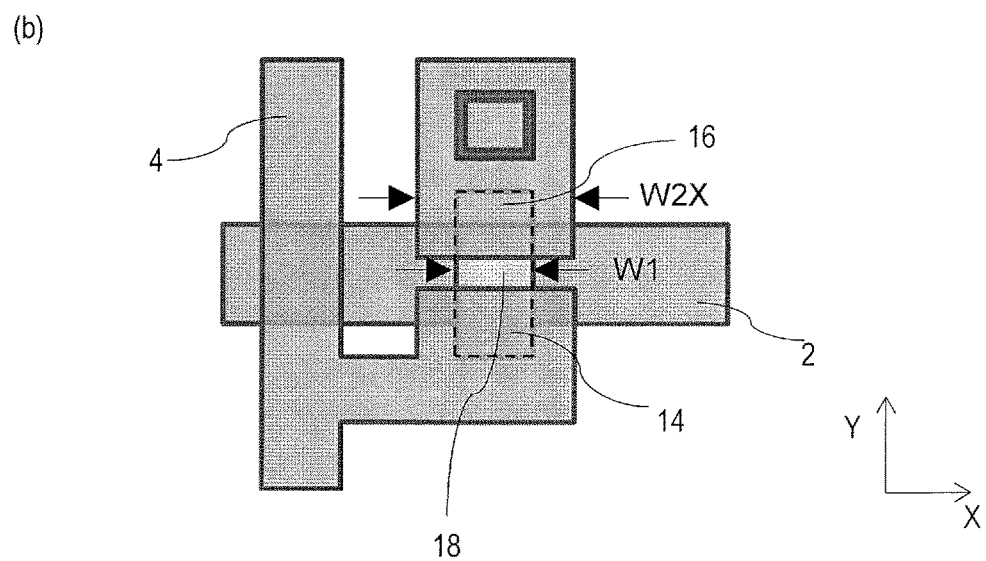
Figure 3:
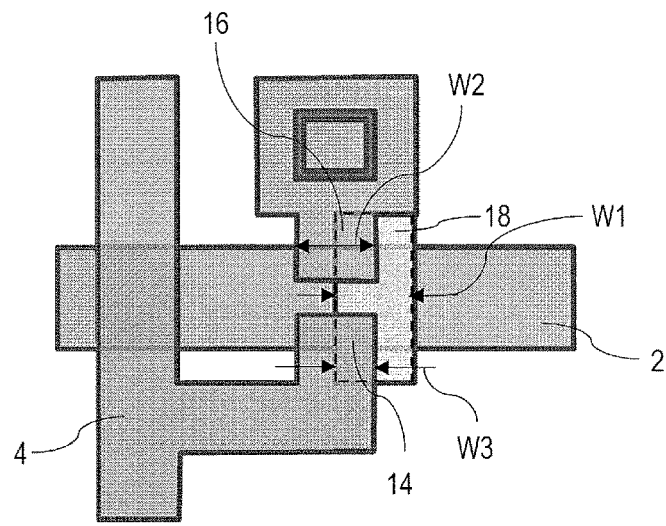
FIG. 3 A plan view showing a configuration of the semiconductor device of Embodiment 1 shown in FIG. 2(a), in which the oxide semiconductor layer is misaligned with the source and drain electrodes.
Figure 4:
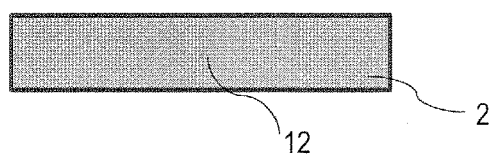
FIG. 4 Plan views illustrating a method for manufacturing the semiconductor device of Embodiment 1, wherein (a) to (c) show different steps.
Figure 4:
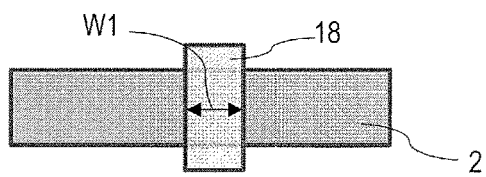
Figure 4:
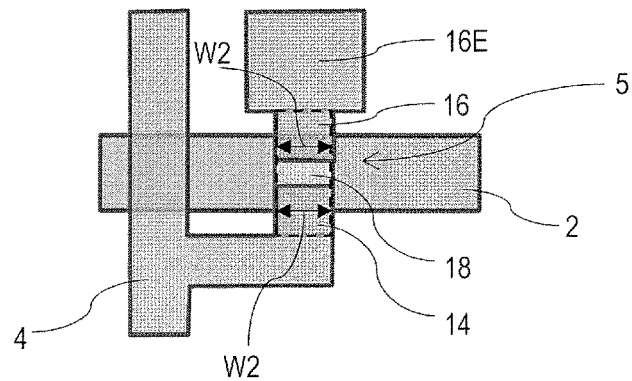
Figure 5:
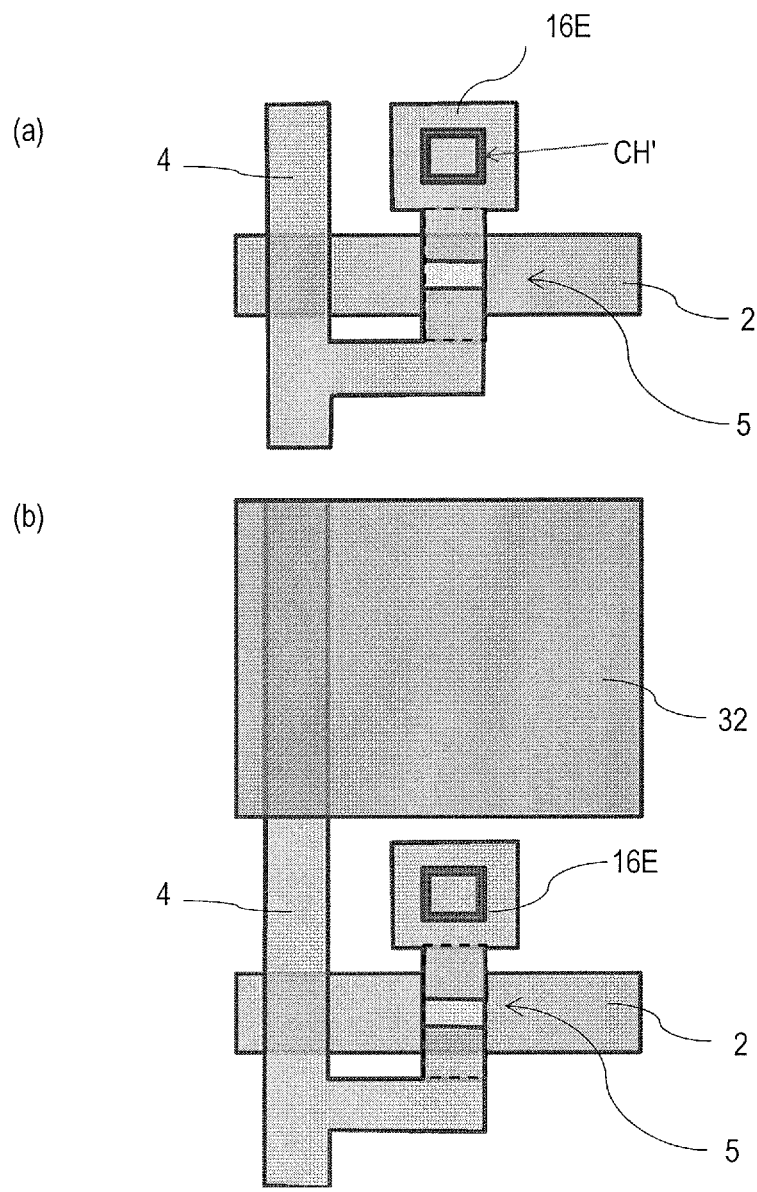
FIG. 5 Plan views illustrating the method for manufacturing the semiconductor device of Embodiment 1, wherein (a) and (b) show different steps.

When width W2=width W1 (or |W1−W2|≤1 μm; this similarly applies hereinbelow), as shown in FIG. 2(a), misalignment may occur. FIG. 3 shows a case where the source electrode 14 and the drain electrode 16 partially overlap with the oxide semiconductor layer 18 in the width direction due to misalignment. It has been confirmed by the present inventors that even when there is such misalignment, the oxide semiconductor TFT can operate normally if the overlap width W3 is in the range of 1 μm to the width W1. Particularly, when the overlap width W3 is 1 μm or more and the channel length is 2 μm or more, it can function sufficiently as a switching element.

Thus, since width W2=width W1 in the present embodiment, when misalignment occurs, the channel width of the TFT 5 may vary, but changes in the characteristics of oxide semiconductor TFT due to the channel width variation is tolerable in practical use. Taking advantage of this characteristic, the parasitic capacitance can be minimized by setting width W2=width W1, and it is possible to suppress the signal delay and the signal blunting and also to reduce the power consumption.

Taking advantage of its high response speed, an oxide semiconductor TFT may also be used as a driver TFT of a drive circuit formed monolithically on a TFT substrate. Herein, it is possible to reduce the device size with such a configuration where the overlap area between the gate electrode and the drain electrode is small as described above. Particularly, with channel-etch type TFTs, the device size can be reduced. Thus, it is possible to narrow the area of the peripheral circuit, and it is possible to contribute to the narrowing of the area outside the display area (which may be referred to as the bezel area) of a portable terminal such as a smart phone.

Referring to FIG. 1 and FIG. 4 to FIG. 6, a method for manufacturing the active matrix substrate 100 will now be described.

First, as shown in FIG. 4(a), a gate layer including the gate electrode 12 and the scanning line 2 is formed on the substrate 10 (see FIG. 1). The substrate 10 may be, for example, a glass substrate, a silicon substrate, a heat-resisting plastic substrate (resin substrate), etc.

The gate electrode 12 and the scanning line 2 can be formed for example by forming a metal film (thickness: 50 nm or more and 500 nm or less, for example) by a sputtering method, or the like, on a glass substrate, and patterning the metal film. The patterning can be done by wet etching using a photolithography method.

A Cu/Ti film including a Ti (thickness: 5 to 100 nm, for example) film and a Cu film (thickness: 100 to 500 nm, for example) layered together is provided in the present embodiment as the metal film for forming the gate layer. Note however that there is no particular limitation on the material of the metal film, and it may suitably be a film containing a metal such as aluminum (Al), tungsten (W), molybdenum (Mo), tantalum (Ta) and chromium (Cr), or an alloy thereof, or a metal nitride thereof.

Then, as shown in FIG. 4(b), the gate insulating layer 20 covering the gate electrode 12, the scanning line 2, etc., is formed (see FIG. 1), and then the oxide semiconductor layer 18, which is typically island-shaped, is formed that at least partially overlaps with the gate electrode 12 with the gate insulating layer 20 interposed therebetween. In the present embodiment, the oxide semiconductor layer 18 is provided to extend across the scanning line 2, and a portion of the region outside the scanning line 2 (or the gate electrode 12) is covered by the oxide semiconductor layer 18.

The gate insulating layer 20 can be obtained for example by forming, as the lower layer, an $SiN_x$ film whose thickness is 200 to 500 nm for preventing diffusion of impurities, or the like, from the substrate 10, and forming thereon, as the upper layer, an $SiO_2$ film whose thickness is 25 to 100 nm, for example. Thus, the gate insulating layer 20 is obtained, including the lower layer formed from $SiN_x$ and the upper layer formed from $SiO_2$.

The oxide semiconductor layer 18 can be formed by depositing an oxide semiconductor film (thickness: 30 nm or more and 200 nm or less, for example) by a sputtering method, and patterning the oxide semiconductor film by a photolithography method. In this step, the width W1 of the oxide semiconductor layer 18, which is defined in the direction (the X direction) parallel to the direction in which the scanning line 2 extends, is set to 3 μm to 6 μm, for example. The width W1 may be the minimum line width that is determined by the process rule, for example.

The oxide semiconductor layer 18 may be formed by layering together a plurality of oxide semiconductor films having different compositions from each other. Such a layered structure can be easily formed by changing the material of the target when sputtering the oxide semiconductor film. With a multi-layer structure oxide semiconductor film (e.g., InGaZnO-based semiconductor film), the composition may be adjusted so that the gallium atomic ratio of the upper layer is greater than the gallium atomic ratio of the lower layer. In the patterning after the provision of the oxide semiconductor film, a resist is provided using a photolithography method, and areas that are not covered by the resist are etched by wet etching. Then, the resist stripping step and the cleaning step are performed.

Then, as shown in FIG. 4(c), a metal film is deposited and patterned by a photolithography method, thereby forming an SD layer including the signal line 4, the source electrode 14 and the drain electrode 16. In the present embodiment, the width W2 of the drain electrode 16 and the width W1 of the oxide semiconductor layer 18 are set to be generally equal to each other, and the patterning is performed so that the edge of the oxide semiconductor layer 18 is located in line (aligned) with the edges of the source electrode 14 and the drain electrode 16.

Note however that the edge of the oxide semiconductor layer 18 may not be in line with the edges of the source electrode 14 and the drain electrode 16 in the Y direction due to misalignment, as shown in FIG. 3. Even in such a case, in the present embodiment, the SD layer is patterned so that the overlap width W3 between the oxide semiconductor layer 18 and the source electrode 14 and the drain electrode 16 in the X direction is 1 μm or more. When the overlap width W3 is less than 1 μm, the channel of the TFT 5 may not be formed properly, and it may be difficult to realize the intended device characteristics. Note that the overlap width W3 is, at maximum, generally equal to the width W1 of the oxide semiconductor layer (or the width W2 of the source and drain electrodes), as shown in FIG. 2.

In this step, the drain extension 16E, which is extended from the drain electrode 16 and which has a larger width than the drain electrode 16, is formed. The drain extension 16E is provided at such a position that it does not overlap with the scanning line 2, and is for obtaining electrical connection between the pixel electrode 30 to be described later and the drain electrode 16. Since the drain extension 16E is formed at a position away from the scanning line 2 and the gate electrode 12, the drain extension 16E, even when provided in a relatively large size, does not increase the parasitic capacitance Cgd. Therefore, the drain extension 16E can be set to a size such that it is possible to realize a sufficient contact with the pixel electrode 30, e.g., a square shape of 10 μm×10 μm, for example. Note however that the drain extension 16E being too large is not preferable as it will reduce the pixel aperture ratio. In view of this, the width of the drain extension 16E in the X direction may be set to 2 μm or more, for example.

Herein, a more specific example step of providing the SD layer will be described below. First, a Ti film is formed to a thickness of 5 to 100 nm by a sputtering method, for example, a Cu film is then formed to a thickness of 100 to 500 nm, and a resist is provided by a photolithography method.

With the resist provided, the upper Cu film is wet-etched, for example, thereby forming an upper layer electrode. The etchant may be an etchant containing hydrogen peroxide $H_2O_2$, for example. Herein, since wet etching is an isotropic etching, a portion of the Cu film covered by the resist may also be etched (side-etched).

Then, the lower Ti film is dry-etched, thereby forming a lower layer electrode. Thus, as shown in FIG. 4(c), the source electrode 14 and the drain electrode 16 are formed, which are separated from each other over the oxide semiconductor layer 18. Thus, the channel-etch type oxide semiconductor TFT 5 is completed. Note that in the step of forming the source electrode 14 and the drain electrode 16 separated from each other, the surface portion of the channel region of the oxide semiconductor layer 18 may also be slightly etched.

As a result of forming the upper layer electrode by wet etching and forming the lower layer electrode by dry etching, as described above, the edge of the lower layer electrode may be located on the outer side with respect to the edge of the upper layer electrode. This gives an advantageous effect that even when Cu is used for the upper layer electrode, the diffusion of Cu into the oxide semiconductor layer 18 is likely to be suppressed by the lower layer electrode. With the configuration described above, the edge of the upper layer electrode is formed on the inner side with respect to the edge of the lower layer electrode, thereby realizing a forwardly-tapered section, and it is therefore realize a good coverage of the protection layer 22 covering the TFT 5.

Note that in the above-described etching step of forming the source electrode 14 and the drain electrode 16, the etching damage may extend to the surface portion of the oxide semiconductor layer 18 being the base layer. For this, it is possible to prevent the device characteristics from deteriorating by employing a two-layer configuration for the oxide semiconductor layer 18 as described above, for example. More specifically, the lower layer of the oxide semiconductor layer 18 having a smaller energy gap, rather than the damaged upper layer thereof, can be positively used as the channel, thereby realizing desirable device characteristics.

After the oxide semiconductor TFT 5 is manufactured as described above, the protection layer 22 (see FIG. 1) is provided so as to cover the entire substrate surface including the oxide semiconductor TFT 5. The protection layer 22 can be obtained for example by forming an $SiO_2$ film to a thickness of 100 to 400 nm by a CVD method, and forming an $SiN_x$ film thereon to a thickness of 20 to 200 nm.

Note that a plasma treatment may be performed by using an oxygen-containing gas after forming the source electrode 14 and the drain electrode 16 and before providing the protection layer 22. Then, it is possible to increase the oxygen concentration of the oxide semiconductor layer 18 exposed between the source and drain electrodes 14 and 16. More specifically, an $N_2O$ plasma treatment may be performed, where $N_2O$ gas flow rate: 3000 sccm, pressure: 200 Pa, plasma power density: 0.15 W/cm$^2$, process time: 10 to 30 sec, substrate temperature: 200° C., for example. Note that the oxidation treatment is not limited to a plasma treatment using an $N_2O$ gas. For example, the oxidation treatment may be performed by a plasma treatment using an $O_2$ gas, an ozone treatment, etc., for example. In order to perform the treatment without increasing the number of steps, it is preferably performed immediately before the step of forming the protection layer to be described later. Specifically, an $N_2O$ plasma treatment may be performed when the protection layer 22 is formed by a CVD method, and an $O_2$ plasma treatment may be performed when the protection layer 22 is formed by a sputtering method. Alternatively, the oxidation treatment may be performed by an $O_2$ plasma treatment using an asking apparatus.

Then, as shown in FIG. 5(a), the flattening layer 24 (see FIG. 1) made of an organic insulating material, for example, is provided on the protection layer 22, and a contact hole CH' is formed at a position corresponding to the drain extension 16E. The flattening layer 24 may be formed from a positive-type photosensitive resin film whose thickness is 1 to 3 μm, for example. The contact hole CH' is an opening provided in the flattening layer 24, and the protection layer 22 at this point is still covering the drain electrode extension 16E in the contact hole CH'.

Then, as shown in FIG. 5(b), the common electrode 32 is formed on the flattening layer 24. The common electrode 32 can be obtained for example by forming a transparent conductive film (not shown) by a sputtering method, for example, on the flattening layer 24, and patterning the transparent conductive film. In the patterning, an opening is formed at a position corresponding to the contact hole CH'. The opening formed in the common electrode 32 is provided so as to expand to the outside of the contact hole CH' (e.g., the outside of the drain extension 16E). Note that although FIG. 5(b) shows the common electrode 32 having a rectangular shape formed above the drain extension 16E, the common electrode 32 may in practice have expanded across the entire substrate surface excluding the opening described above. The configuration may be such that common electrodes 32 each provided for one pixel are connected together by Al lines, or the like, which are provided so as to overlap with the scanning lines 2 and the signal lines 4.

Note that the transparent conductive film used for forming the common electrode 32 may be an ITO (indium tin oxide) film (thickness: 50 nm or more and 200 nm or less, for example), an IZO (indium zinc oxide) film, a ZnO (zinc oxide) film, etc.

Then, as shown in FIG. 6(a), the inter-layer insulating layer 26 (see FIG. 1) is provided on the common electrode 32, and the inter-layer insulating layer 26 inside the contact hole CH' and the protection layer 22 are etched, thereby forming the contact hole CH, through which the drain extension 16E is exposed. Note that it is only required that the inter-layer insulating layer 26 is removed on the bottom of the contact hole CH, and the side surface of the contact hole CH may still be covered.

The inter-layer insulating layer 26 may be obtained by forming, by a CVD method, a silicon oxide ($SiO_2$) film, a silicon nitride ($SiN_x$) film, a silicon oxide nitride ($SiO_xN_y$) film, a silicon nitride oxide ($SiN_xO_y$) film, etc., (thickness: 100 to 400 nm, for example), for example.

Then, as shown in FIG. 6(b), the pixel electrode 30 is formed. The pixel electrode 30 can be obtained by forming a transparent conductive film (not shown) by a sputtering method, for example, in the contact hole CH and on the inter-layer insulating layer 26, and patterning the transparent conductive film. The pixel electrode 30 may have a comb-like planar shape as shown in FIG. 6(b), or may have a planar shape with one or more slits therein.

The transparent conductive film used for forming the pixel electrode 30 may be an ITO (indium tin oxide) film (thickness: 50 nm or more and 150 nm or less), an IZO film, a ZnO film (zinc oxide film), etc., for example.

The active matrix substrate 100 is produced through the steps described above. Moreover, a liquid crystal panel can be produced by using the active matrix substrate 100 formed as described above. A liquid crystal panel can be produced by providing the active matrix substrate 100 described above and an opposing counter substrate, and providing a liquid crystal layer therebetween. A liquid crystal layer is provided between substrates while being surrounded by a sealant by using a known method such as a vacuum injection method or an ODF method.

(Embodiment 2)

An active matrix substrate according to Embodiment 2 of the present invention will now be described.

Figure 7:
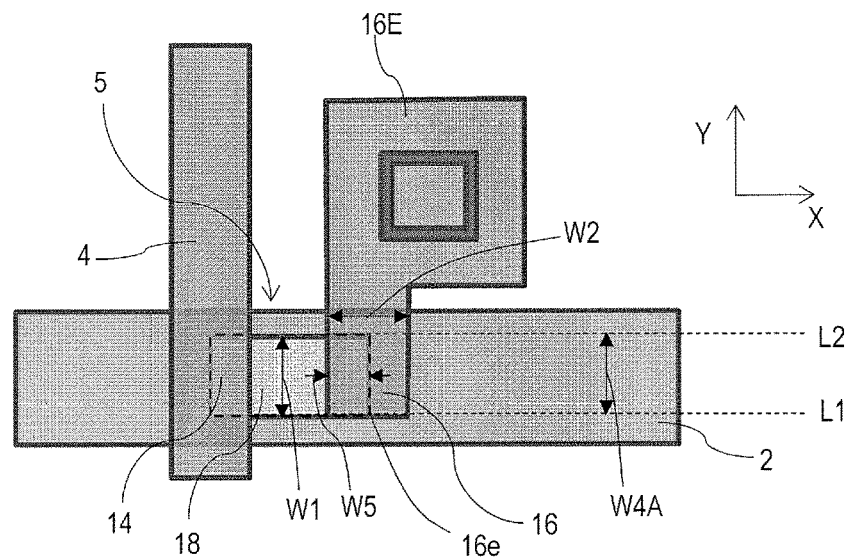
FIG. 7 A schematic plan view showing, on an enlarged scale, the vicinity of a TFT of a semiconductor device (active matrix substrate) of Embodiment 2.

FIG. 7 shows the vicinity of a TFT of the active matrix substrate of Embodiment 2. Also in the present embodiment, the channel-etch type oxide semiconductor TFT 5 is provided on the substrate. Note that elements having similar functions to those of the active matrix substrate 100 of Embodiment 1 will be denoted by the same reference signs, and detailed description thereof may be omitted below for the sake of simplicity.

In the present embodiment, the oxide semiconductor layer 18 is provided in an island shape along the direction (the X direction) in which the scanning line 2 extends, and the oxide semiconductor layer 18 entirely overlaps with the scanning line 2. That is, the oxide semiconductor layer 18 is provided over the scanning line 2 and within the scanning line 2 so as not to extend past the edge of the scanning line 2. Note that also in the present embodiment, a portion of the scanning line 2 that overlaps with the oxide semiconductor layer 18 functions as the gate electrode 12.

In the present embodiment, the signal line 4 is in contact with the oxide semiconductor layer 18 in an area where the signal line 4 crosses the scanning line 2. A portion of the signal line 4 that is in contact with the oxide semiconductor layer 18 functions as the source electrode 14.

In the present embodiment, the drain electrode 16, which has the width W2 in the direction (the X direction) in which the scanning line 2 extends, extends from the connecting portion with the oxide semiconductor layer 18 and past the edge on one side of the scanning line 2 to be connected to the drain extension 16E. In this configuration, the width W1 of the oxide semiconductor layer and the width W2 of the drain electrode may have the minimum width (e.g., 3 μm to 6 μm) that is determined by the process rule. Also in the present embodiment, the width W1 of the oxide semiconductor layer and the width W2 of the drain electrode are set to be substantially equal to each other (i.e., |W1−W2|≤1 μm).

Note that in the present embodiment, the width W2 of the drain electrode 16 is a width that is defined in the direction (herein, the X direction) perpendicular to the direction in which the drain electrode 16 projects toward the scanning line and the oxide semiconductor layer 18. On the other hand, the width W1 of the oxide semiconductor layer 18 is a width that is defined in the channel width direction of the TFT 5, and is defined in the Y direction in the present embodiment. In the present embodiment, the width W1 of the oxide semiconductor layer 18 corresponds to the channel width of the TFT 5.

In the present embodiment, a distal edge 16e of the drain electrode 16 is provided at a position that is aligned with one of the edge extension lines L1 and L2 on both sides of the oxide semiconductor layer 18 defined in the X direction that is farther away from the drain extension 16E, i.e., the edge extension line L1.

Thus, by setting the width W1 of the oxide semiconductor layer and the width W2 of the drain electrode 16 to the minimum width, and locating the distal edge 16e of the drain electrode on the edge extension line L1 of the oxide semiconductor layer 18, it is possible to obtain appropriate device characteristics while reducing the parasitic capacitance Cgd as much as possible. It is also possible to reduce the device size of the TFT 5.

Note that in this configuration, the width W4A (the overlap width W4) in the Y direction of an area (overlapping portion) where the oxide semiconductor layer 18 and the drain electrode 16 are in contact with each other is generally equal to the width W1 of the oxide semiconductor layer 18 (i.e., |W1−W4|≤1 μm). The width W5 of the overlapping portion in the X direction may be appropriately set such that it is possible to sufficiently achieve connection between the oxide semiconductor layer 18 and the drain electrode 16, e.g., 1 μm or more. Note that while the width W5 may vary due to misalignment, the width W5 may be designed to be generally a half of the width W2 of the drain electrode 16, for example, in order to ensure that the width W5 is 1 μm or more. The width W5 of the overlapping portion in the X direction is, at maximum, generally equal to the width W2 of the drain electrode 16.

Figure 8:
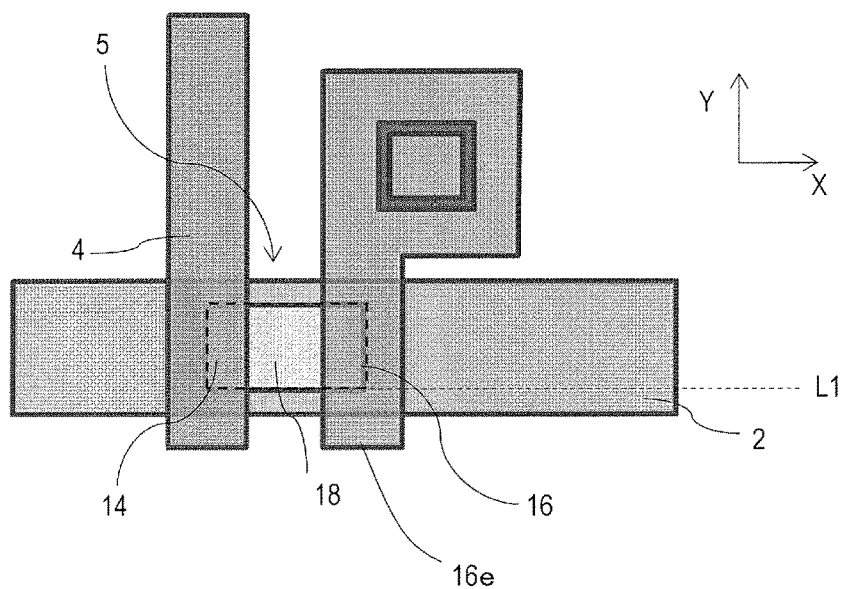
FIG. 8 A schematic plan view showing, on an enlarged scale, the vicinity of a TFT of a semiconductor device of a reference example.

FIG. 8 shows the vicinity of a TFT of an active matrix substrate of a reference example. In the reference example shown in FIG. 8, the distal edge 16e of the drain electrode 16 is provided at a position that is past the edge extension line L1 of the oxide semiconductor layer 18 and further past the edge of the scanning line. In this configuration, as compared with the configuration of the embodiment shown in FIG. 7, the overlap area between the scanning line 12 and the drain electrode 16 is large, resulting in an unnecessarily high parasitic capacitance Cgd. Therefore, in order to reduce the parasitic capacitance Cgd, it is preferred that the distal edge 16e of the drain electrode 16 does not extend past the edge extension line L1 of the oxide semiconductor layer 18.

(Embodiment 3)

An active matrix substrate (semiconductor device) according to Embodiment 3 of the present invention will now be described.

Figure 9:
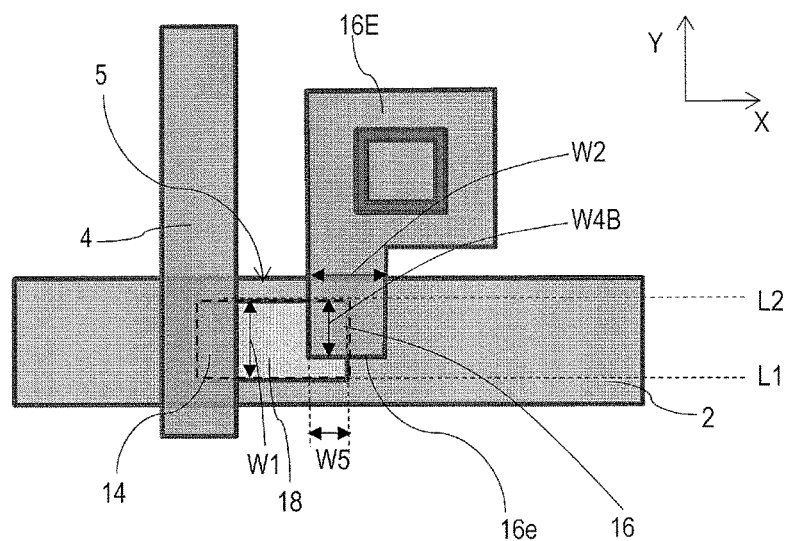
FIG. 9 A schematic plan view showing, on an enlarged scale, the vicinity of a TFT of a semiconductor device (active matrix substrate) of Embodiment 3.

FIG. 9 shows the vicinity of a TFT of the active matrix substrate of Embodiment 3. Also in the present embodiment, the channel-etch type oxide semiconductor TFT 5 is provided on the substrate. Note that elements having similar functions to those of the active matrix substrate 100 of Embodiment 2 will be denoted by the same reference signs, and detailed description thereof may be omitted below for the sake of simplicity.

Also in the present embodiment, as in Embodiment 2, the oxide semiconductor layer 18 is provided in an island shape along the direction (the X direction) in which the scanning line 2 extends, and the oxide semiconductor layer 18 entirely overlaps with the scanning line 2. A portion of the scanning line 2 that overlaps with the oxide semiconductor layer 18 functions as the gate electrode 12.

As in Embodiment 2, the signal line 4 and the oxide semiconductor layer 18 are in contact with each other in an area where the signal line 4 crosses the scanning line 2. A portion of the signal line 4 that is in contact with the oxide semiconductor layer 18 functions as the source electrode 14.

As in Embodiment 2, the drain electrode 16, which has the width W2 in the direction (the X direction) parallel to the direction in which the scanning line 2 extends, extends from the connecting portion with the oxide semiconductor layer 18 and past the edge on one side of the scanning line 2 to be connected to the drain extension 16E. In this configuration, the width W1 of the oxide semiconductor layer and the width W2 of the drain electrode may have the minimum width (e.g., 3 μm to 6 μm) that is determined by the process rule. Also in the present embodiment, the width W1 of the oxide semiconductor layer and the width W2 of the drain electrode are set to be substantially equal to each other (i.e., |W1−W2|≤1 μm).

Also in the present embodiment, as in Embodiment 2, the oxide semiconductor layer has a width that is defined in the channel width direction of the TFT 5, and the width W2 of the drain electrode 16 is a width that is defined in the direction perpendicular to the direction in which the drain electrode 16 projects toward the scanning line 2 and the oxide semiconductor layer 18.

In the present embodiment, the distal edge 16a of the drain electrode 16 is located between the edge extension lines L1 and L2 on both sides of the oxide semiconductor layer 18 defined in the X direction. That is, the width W4B (the overlap width W4) in the Y direction of the overlapping portion between the oxide semiconductor layer 18 and the drain electrode 16 is smaller than the width W1 of the oxide semiconductor layer 18.

Thus, by setting the width W1 of the oxide semiconductor layer 18 and the width W2 of the drain electrode 16 to the minimum width, and locating the distal edge 16a of the drain electrode between the edge extension lines L1 and L2 on both sides of the oxide semiconductor layer 18, it is possible to obtain appropriate device characteristics while reducing the parasitic capacitance Cgd as much as possible.

In the present embodiment, since the width W4B of the overlapping portion described above is smaller than the width W1 of the oxide semiconductor layer 18, it may not be possible to define the channel of the TFT 5 as a rectangular area as in Embodiment 2. Note however that it has been confirmed by the present inventors that even in such a case, it is possible to realize desirable device characteristics for reasons such as the mobility of the oxide semiconductor layer 18 being high. Thus, the present embodiment further reduces the parasitic capacitance Cgd by deliberately employing a configuration in which the connecting portion between the source electrode and the oxide semiconductor layer is asymmetric with the connecting portion between the drain electrode and the oxide semiconductor layer.

Note that the width W4B of the overlapping portion between the oxide semiconductor layer 18 and the drain electrode 16 is preferably 1 μm or more. Ensuring that the width W4B is 1 μm or more, it is possible to sufficiently achieve connection between the oxide semiconductor layer 18 and the drain electrode 16. Note that the width W5 of the overlapping portion described above in the X direction may be 1 μm or more, for example, as in Embodiment 2.

While embodiments of the present invention have been described above, various modifications can be made thereto. For example, the configuration may be such that the gate electrode is provided as a portion projecting in the Y direction from the scanning line 2 extending in the X direction, and the oxide semiconductor layer and the drain electrode, which are set to the minimum width, are connected to each other over the gate electrode. Note however that it is possible to further reduce the size of the device by employing a configuration (TFT on gate) in which a portion of the scanning line 2 is used as the gate electrode 12 and the TFT is formed over the gate electrode 12, as illustrated in Embodiments 1 to 3 described above.

INDUSTRIAL APPLICABILITY

The embodiments of the present invention are widely applicable to various semiconductor devices having oxide semiconductor TFTs. For example, the embodiments of the present invention are applicable to circuit substrates such as active matrix substrates, display devices such as liquid crystal display devices, organic electroluminescence (EL) display devices and inorganic electroluminescence display devices, imaging devices such as image sensor devices, and various electronic devices such as image input devices, fingerprint reader devices and semiconductor memories.

REFERENCE SIGNS LIST

2 Scanning line
4 Signal line

5 Oxide semiconductor TFT
10 Substrate
12 Gate electrode
14 Source electrode
16 Drain electrode
18 Oxide semiconductor layer
20 Gate insulating layer
22 Protection layer
24 Flattening layer
26 Inter-layer insulating layer
30 Pixel electrode
32 Common electrode
100 Active matrix substrate (semiconductor device)

The invention claimed is:

1. A semiconductor device comprising:
a substrate; and
a thin film transistor supported on the substrate, the thin film transistor including a gate electrode, an oxide semiconductor layer, a gate insulating layer provided between the gate electrode and the oxide semiconductor layer, and a source electrode and a drain electrode electrically connected to the oxide semiconductor layer,
a signal line connected to the source electrode and a scanning line connected to the gate electrode, the scanning line extending along a first direction and the signal line extending along a second direction crossing the first direction,
wherein:
the drain electrode, the source electrode and the oxide semiconductor layer are arranged in line along either the first direction or the second direction;
the source electrode is shaped so as to project along the second direction, and the drain electrode is arranged so as to oppose the source electrode with the oxide semiconductor layer interposed therebetween;
the drain electrode is shaped so as to project toward the oxide semiconductor layer;
a width W1 and a width W2 satisfy a relationship |W1−W2|≤1 µm, where the width W1 is a width of the oxide semiconductor layer in a channel width direction of the thin film transistor, and the width W2 is a width of the drain electrode in a direction perpendicular to a direction in which the drain electrode projects;
the width W1 and the width W2 are 3 µm or more and 6 µm or less;
the oxide semiconductor layer and the drain electrode are misaligned from each other in the first direction; and
a width W3 is 1 µm or more and is less than the width W1, where the width W3 is a width in the first direction of an overlapping portion between the oxide semiconductor layer and the drain electrode.

2. The semiconductor device according to claim 1, wherein the gate electrode is a portion of the scanning line, and the scanning line including the gate electrode extends straight along the first direction.

3. The semiconductor device according to claim 1, wherein a connecting portion between the sign and line and the source electrode and an extension of the drain electrode opposing the source electrode are located on opposite sides of the scanning line therebetween.

4. The semiconductor device according to claim 1, wherein the oxide semiconductor layer is provided so as to extend past opposite edges of the scanning line.

5. The semiconductor device according to claim 1, wherein the oxide semiconductor layer includes In, Ga and Zn.

6. The semiconductor device according to claim 1, wherein the oxide semiconductor layer includes a crystalline portion.

7. The semiconductor device according to claim 1, wherein the thin film transistor is a channel-etch type TFT.

8. A semiconductor device comprising:
a substrate; and
a thin film transistor supported on the substrate, the thin film transistor including a gate electrode, an oxide semiconductor layer, a gate insulating layer provided between the gate electrode and the oxide semiconductor layer, and a source electrode and a drain electrode electrically connected to the oxide semiconductor layer,
a signal line connected to the source electrode and a scanning line connected to the gate electrode, the scanning line extending along a first direction and the signal line extending along a second direction crossing the first direction,
wherein:
the drain electrode, the source electrode and the oxide semiconductor layer are arranged in line along either the first direction or the second direction;
the source electrode is a portion of the signal line that is connected to the oxide semiconductor layer;
the drain electrode is shaped to extend along the second direction past an edge of the scanning line so as to project onto the scanning line toward the oxide semiconductor layer;
a width W1 and a width W2 satisfy a relationship |W1−W2|≤1 µm, where the width W1 is a width of the oxide semiconductor layer in a channel width direction of the thin film transistor, and the width W2 is a width of the drain electrode in a direction perpendicular to a direction in which the drain electrode projects;
the width W1 and the width W2 are 3 µm or more and 6 µm or less; and
a length in the second direction of an overlapping portion between the oxide semiconductor layer and the drain electrode is 1 µm or more and is less than or equal to the width W1.

9. The semiconductor device according, to claim 8, wherein the oxide semiconductor layer is provided over the scanning line and within the scanning line so as not to extend past an edge of the scanning line.

* * * * *